US006946840B1

(12) United States Patent  (10) Patent No.: US 6,946,840 B1
Zou et al.  (45) Date of Patent: Sep. 20, 2005

(54) INTEGRATED AND INDEPENDENTLY CONTROLLED TRANSMIT ONLY AND RECEIVE ONLY COIL ARRAYS FOR MAGNETIC RESONANCE SYSTEMS

(75) Inventors: Mark Xueming Zou, Aurora, OH (US); Labros S. Petropoulos, Solon, OH (US); Joseph Murphy-Boesch, Aurora, OH (US); Pei Chan, Aurora, OH (US); Rony Thomas, Aurora, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/093,051

(22) Filed: Mar. 7, 2002

Related U.S. Application Data

(60) Provisional application No. 60/274,523, filed on Mar. 8, 2001.

(51) Int. Cl.[7] .............................................. G01V 3/00
(52) U.S. Cl. ..................................... 324/318; 324/322
(58) Field of Search ................................ 324/318, 322, 324/313, 314, 309, 307, 300, 319; 128/653.5; 600/410

(56) References Cited

U.S. PATENT DOCUMENTS

| 4,825,162 A | 4/1989 | Roemer et al. | |
| 5,198,768 A | 3/1993 | Keren | |
| 5,543,711 A * | 8/1996 | Srinivasan et al. | 324/318 |
| 6,029,081 A * | 2/2000 | DeMeester et al. | 600/410 |
| 6,040,697 A * | 3/2000 | Misic | 324/318 |
| 6,150,816 A * | 11/2000 | Srinivasan | 324/318 |
| 6,323,648 B1 * | 11/2001 | Belt et al. | 324/322 |
| 6,356,081 B1 * | 3/2002 | Misic | 324/318 |
| 6,377,044 B1 * | 4/2002 | Burl et al. | 324/307 |
| 6,396,273 B2 * | 5/2002 | Misic | 324/318 |

OTHER PUBLICATIONS

G. Randy Duensing, et al., "Transceive Phased Array Designed for Imaging at 3.0T", Proceedings of International Society of Magnetic Resonance, 1998, p. 441.

G.R. Duensing, et al., "Transmission Field Profiles for Transceive Phased Array Coils", Proceedings of International Society of Magnetic Resonance, Med. 8, (2000), p. 143.

P. B. Roemer, et al., "Simultaneous Multiple Surface Coil NMR Imaging", Society of Magnetic Resonance Imaging Abstracts, Aug. 20-25, 1988, p. 875.

P. Roemer, et al., "The NMR Phased Array", Magnetic Resonance in Medicine 16, (1990), pp. 192-225.

* cited by examiner

*Primary Examiner*—Brij B. Shrivastav
(74) *Attorney, Agent, or Firm*—Carl B. Horton, Esq.; Armstrong Teasdale LLP

(57) ABSTRACT

A MRI array coil includes a plurality of first coils in a receive coil array and a plurality of second coils in a transmit coil array. The receive coil array and the transmit coil array are electrically disjoint.

27 Claims, 9 Drawing Sheets

INTEGRATED AND INDEPENDENTLY CONTROLLED TRANSMIT ONLY AND RECEIVE ONLY COIL ARRAYS FOR MAGNETIC RESONANCE SYSTEMS

CROSS-REFERENCE TO RELATED APPLICATION

This application claims the benefit of U.S. provisional patent application Ser. No. 60/274,523 filed Mar. 8, 2001.

BACKGROUND OF THE INVENTION

The present invention relates to magnetic resonance imaging and, in particular, to radio frequency coils.

Radio frequency (RF) coils are used produce and/or sense the magnetic resonance (MR) signal used in magnetic resonance imaging (MRI). A main static magnetic field aligns the nuclei of interest, gradient coils provide indicia of spacial location and the transmit and receive RF coils produce the desired contrast signal.

A MR scanner with a horizontally directed main field will normally have the main field parallel with the scanner's main symmetry plane. These scanners are the original MR scanners.

A MR scanner with a vertically directed main field will normally have the main field orthogonal to the pole surface and to the main magnet's symmetry plane. These scanners are normally called open magnet MR scanners.

Signal to noise ratios (SNRs) for RF receive coils have been increased by the use of smaller receive coils. In order to preserve the desired field of view (FOV), such receive coils have been combined into a phased array of such coils. In some cases a large transmit RF coil is used for the entire FOV. In other cases, one or more of the receive coils is operated as a transceiver coil, both exciting the nuclei and sensing the resulting signal.

As main field strength has increased, it has become difficult to power a single large transmit coil for rapid imaging applications at high field strength. The alternative has been to use smaller transceiver coils as part of a coil array, but these have other problems. Because of coils being used for both transmitting and receiving, there is no means to optimize such factors as field uniformity for both transmitting and receiving. In addition, decoupling and phase correction of the coils in an array becomes more complicated and difficult.

SUMMARY OF THE INVENTION

A MRI array coil includes a plurality of first coils in a receive coil array and a plurality of second coils in a transmit coil array. The receive coil array and the transmit coil array are electrically disjoint.

DESCRIPTION OF THE PREFERRED EMBODIMENTS

Figure 1:
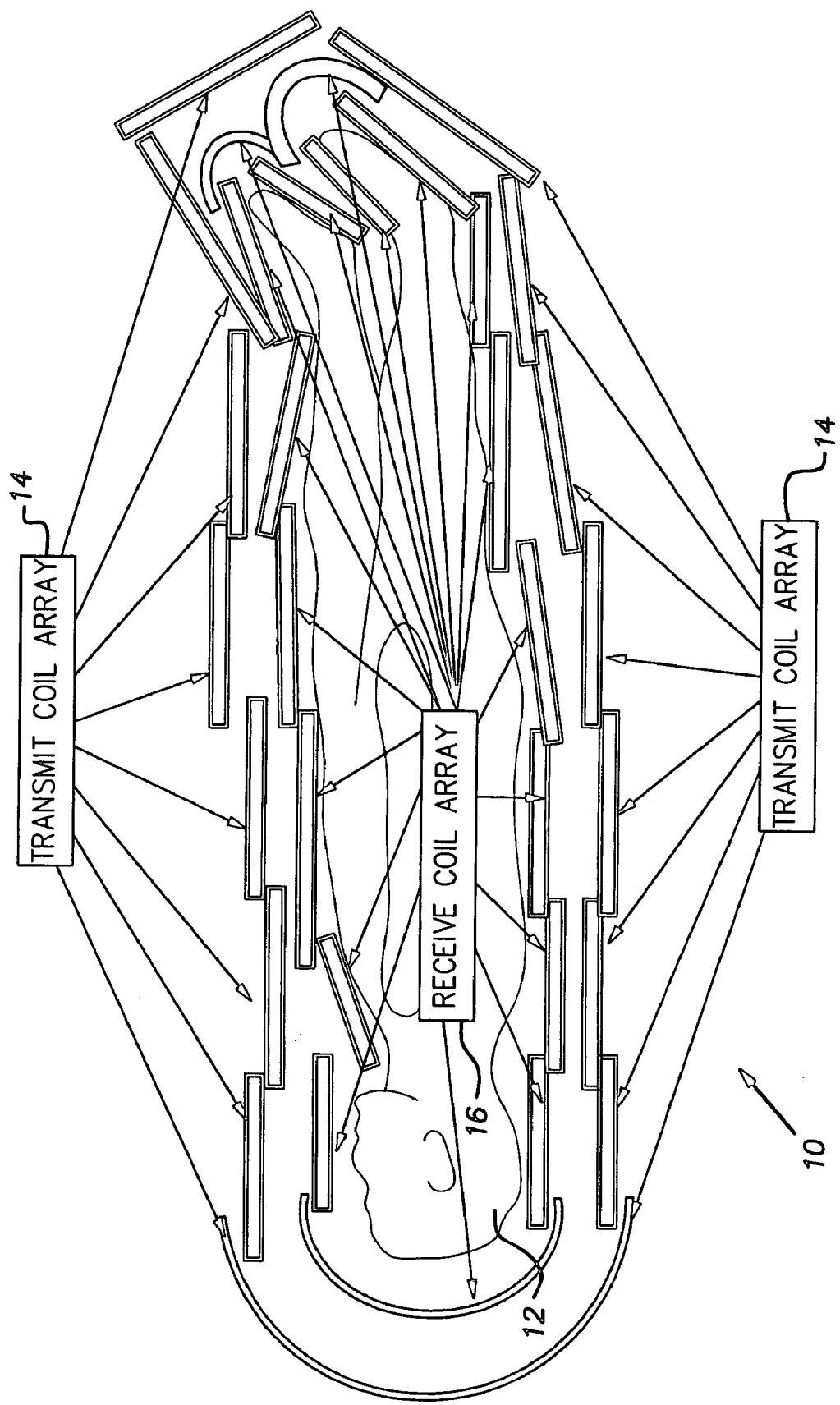
FIG. 1 is a schematic diagram of an array coil according to the invention having a whole body field of view.

Referring to FIG. 1, a MRI array coil 10 is shown positioned about the body 12 of a subject. The FOV of the coil 10 can include the whole of the body 12. The transmit coil array 14 and the receive coil array 16 are integrated into a common support structure, which is not shown. The support structure may be, for example, plastic, foam or other suitable materials in such forms, for example, as clamshell, split-top, solid or split into various sections suitable for arranging about the subject. The individual coils may be chosen as linear or quadrature and surface or volume, depending on the desired application. The embodiment of FIG. 1 has a one-to-one correspondence between transmit and receive coils. The transmit coil array 14 and the receive coil 16 are electrically disjoint.

During transmission selected transmit coils are turned on and all the receive coils are turned off and during receiving selected receive coils are turned on and all of the transmit coils are turned off.

The use of small coils with respect the overall FOV allows relatively low power to be applied to the transmit coil array 14 compared to a large coil encompassing the entire FOV and a high signal to noise ratio to be achieved with the receive coil array 16. In addition, because the arrays 14, 16 are electrically disjoint, each array can be optimized for its function, transmit or receive. Also, decoupling and phase correction can be independently pursued for each array. The small size of all of the coils also permits optimal conformance with the subject with resulting improvements in SNR.

It should be apparent to one skilled in the art that an MRI array coil such as this can be used in horizontal as well as vertical field MR scanners. The use of such MRI array coils have the further advantage of limiting unnecessary RF leakage out of the imaging region and thus eliminating aliasing or cusp artifacts.

Figure 2:
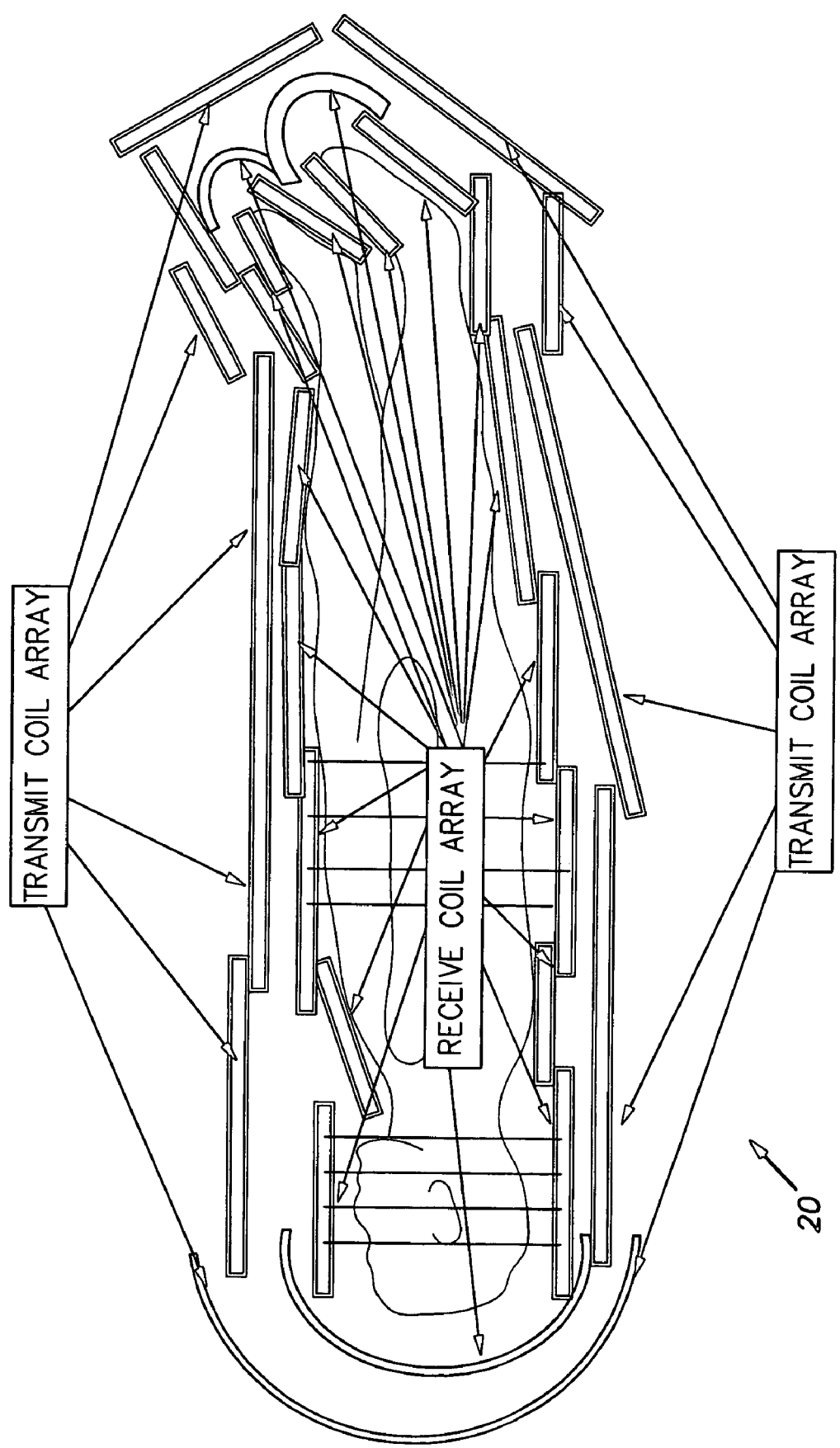
FIG. 2 is a schematic diagram of another array coil according to the invention having a whole body field of view.

Referring to FIG. 2, a MRI array coil 20 similar to the array coil 10 is illustrated. This embodiment has unequal numbers of transmit and receive coils. In this case, a transmit coil may be associated with more than one receive coil.

Figure 3:
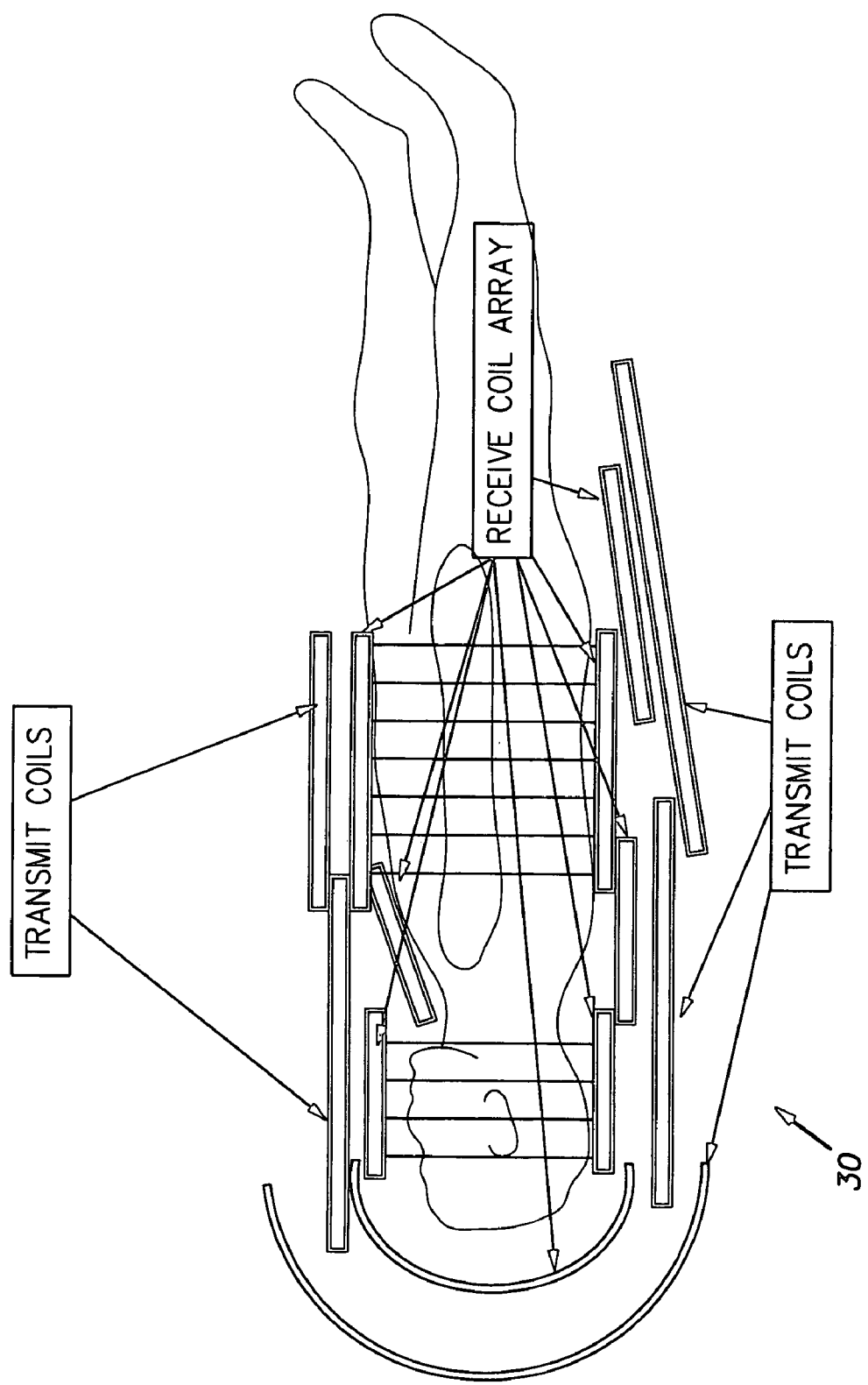
FIG. 3 is a schematic diagram of an array coil according to the invention having an upper body field of view.

Referring to FIG. 3, a similar MRI array coil 30 illustrates a MRI coil array having a FOV covering the upper half of the subject.

Figure 4:
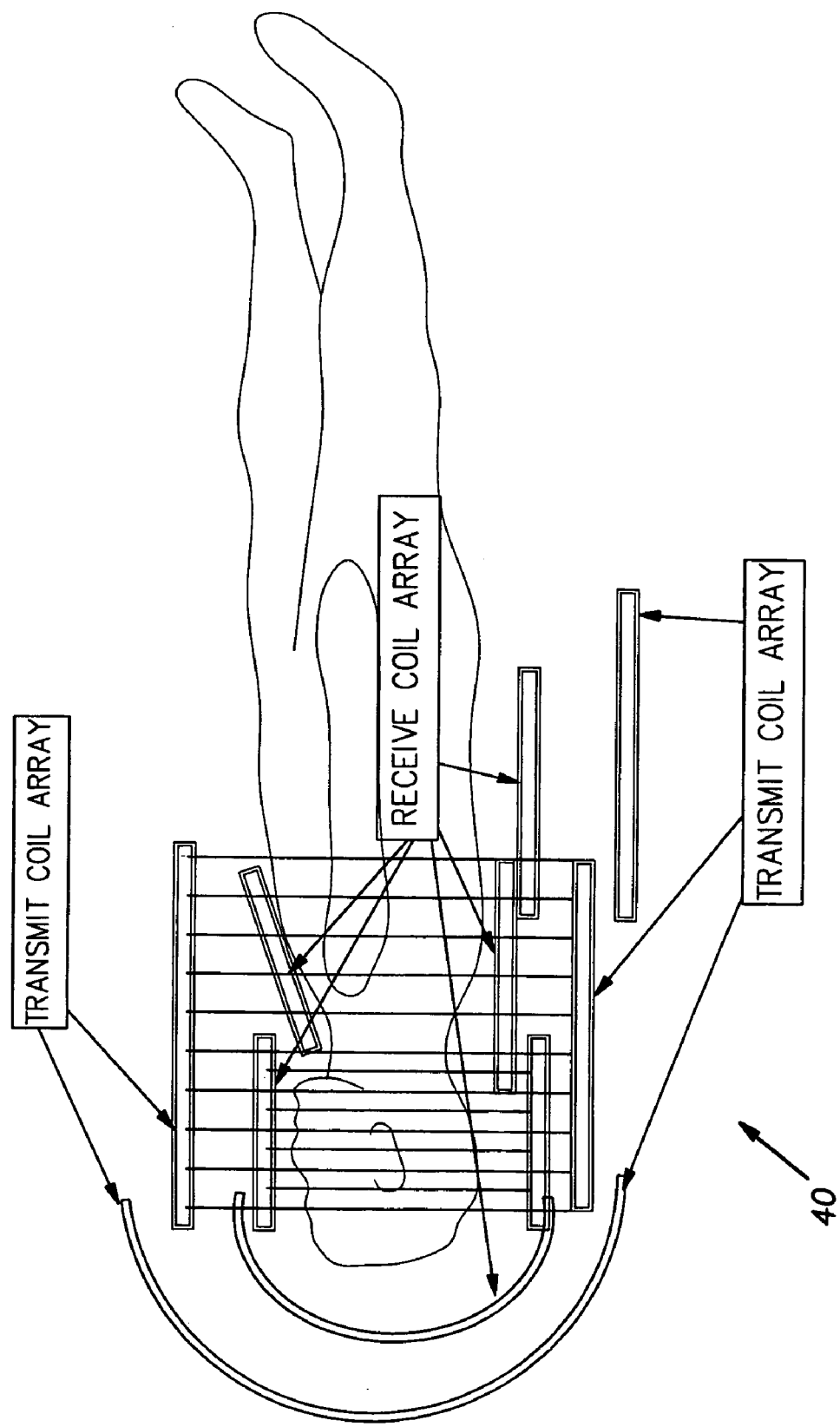
FIG. 4 is a schematic diagram of an array coil according to the invention having a head and chest field of view.

Referring to FIG. 4, a similar MRI array coil 40 illustrates a MRI coil array having a FOV covering the head and chest of the subject, suitable for neurovascular imaging.

Figure 5:
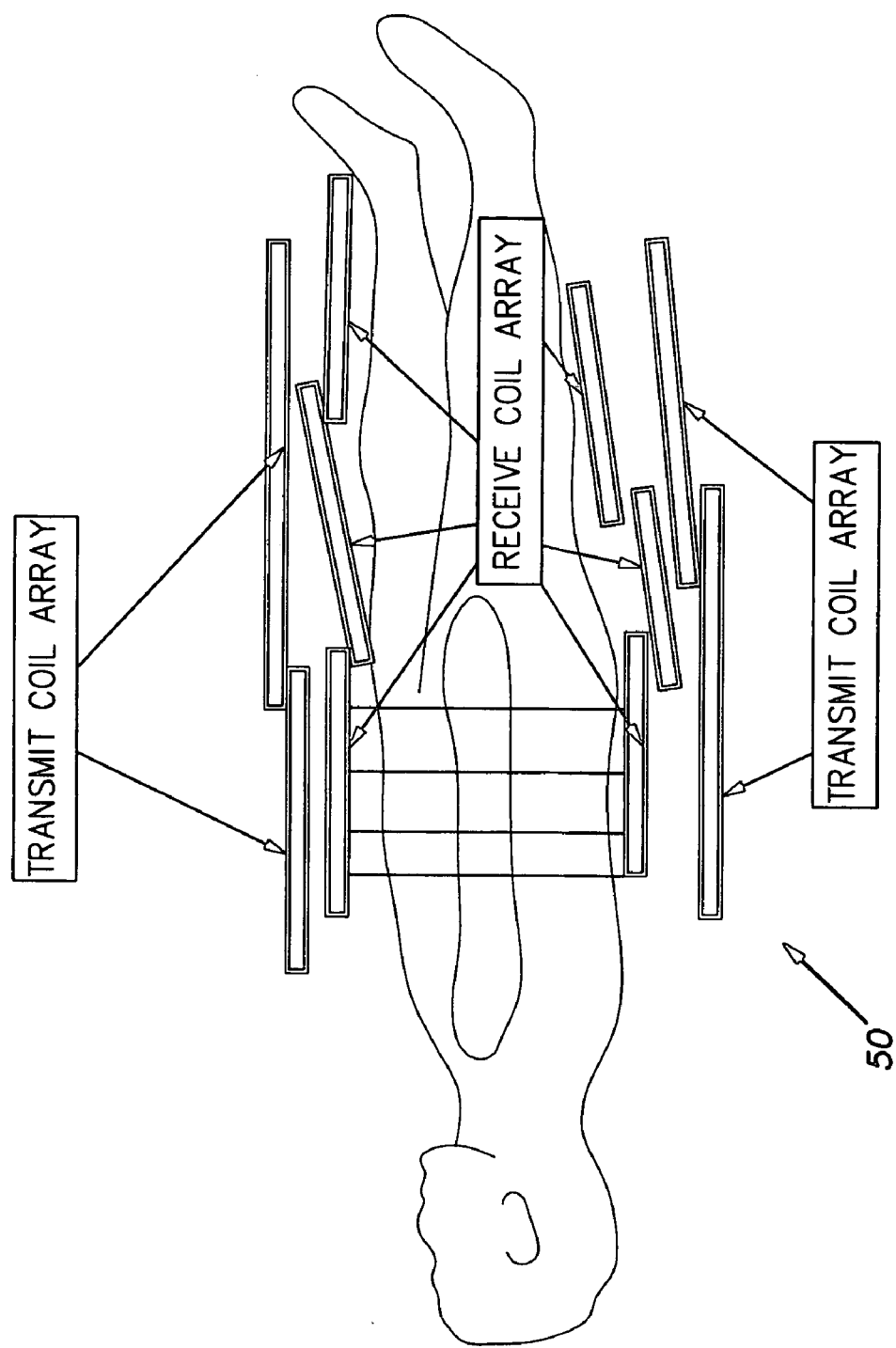
FIG. 5 is a schematic diagram of an array coil according to the invention having a torso and/or pelvis field of view.

Referring to FIG. 5, a similar MRI array coil 50 illustrates a MRI coil array having a FOV covering the torso and/or the pelvis of the subject.

Figure 6:
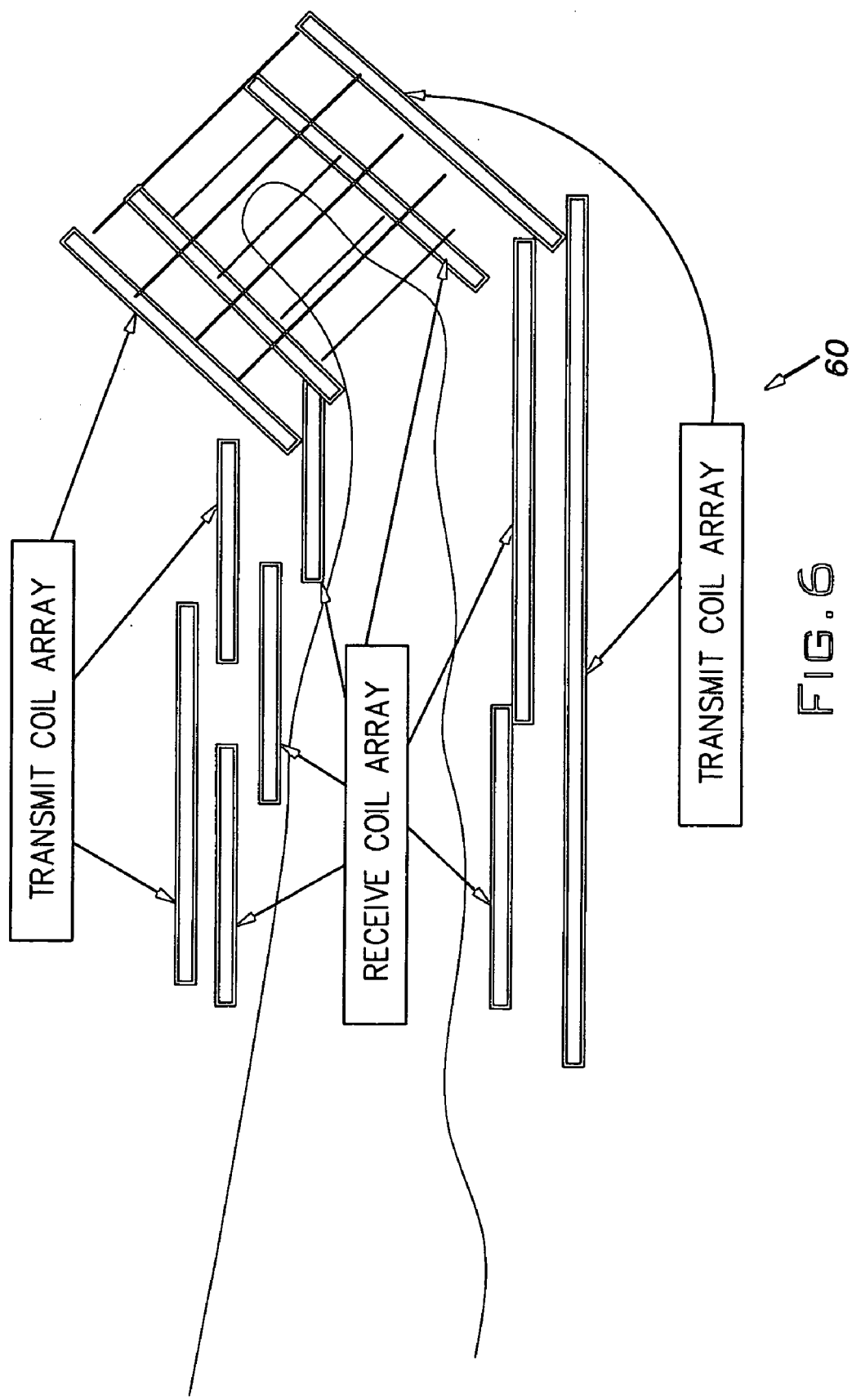
FIG. 6 is a schematic diagram of an array coil according to the invention having a knee and/or foot field of view.

Referring to FIG. 6, a similar MRI array coil 60 illustrates a MRI coil array having a FOV covering the knee and/or the foot of the subject.

Figure 7:
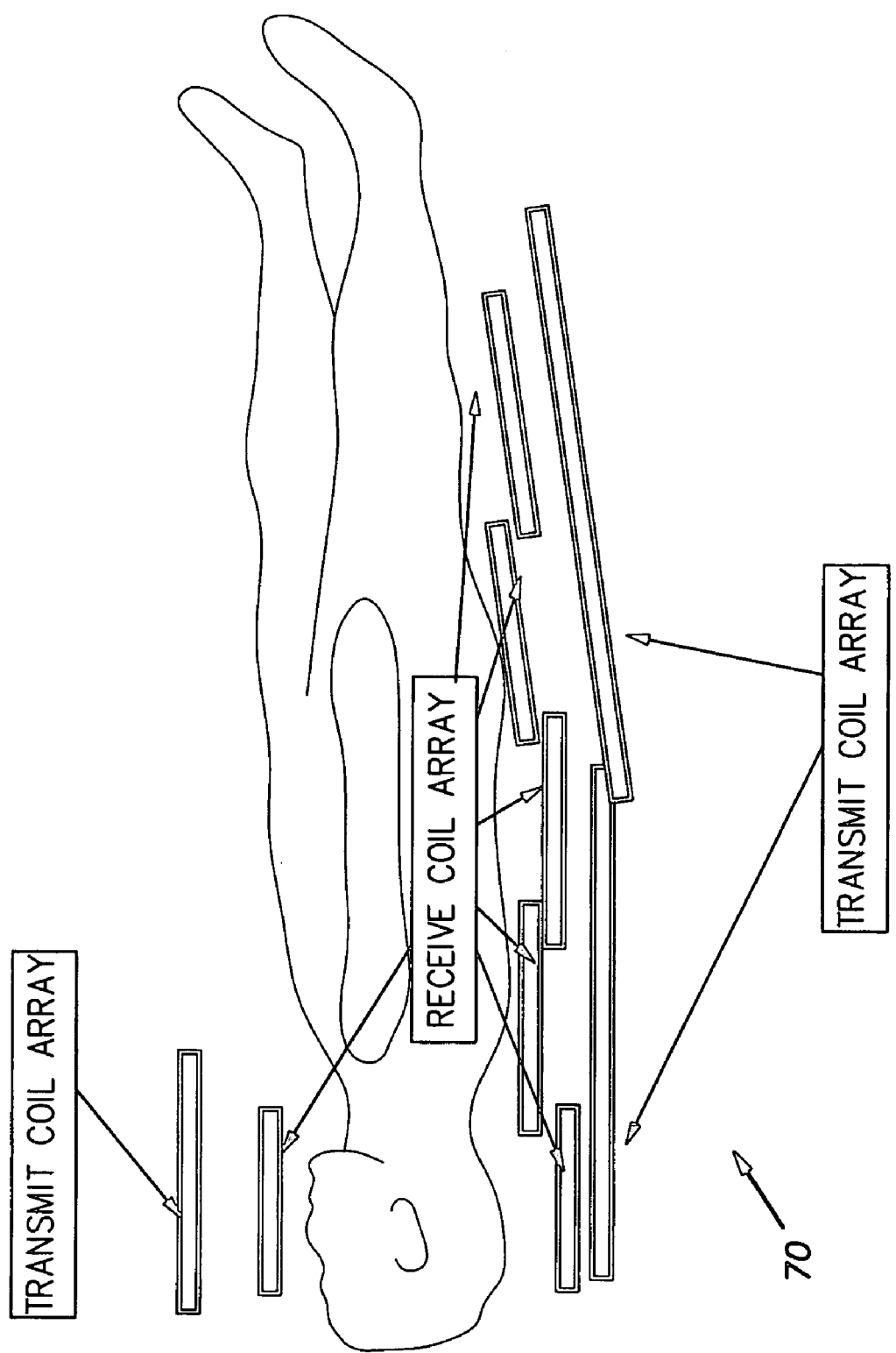
FIG. 7 is a schematic diagram of an array coil according to the invention having a spine and/or neck field of view.

Referring to FIG. 7, a similar MRI array coil 70 illustrates a MRI coil array having a FOV covering the spine and/or the neck of the subject.

Figure 8:
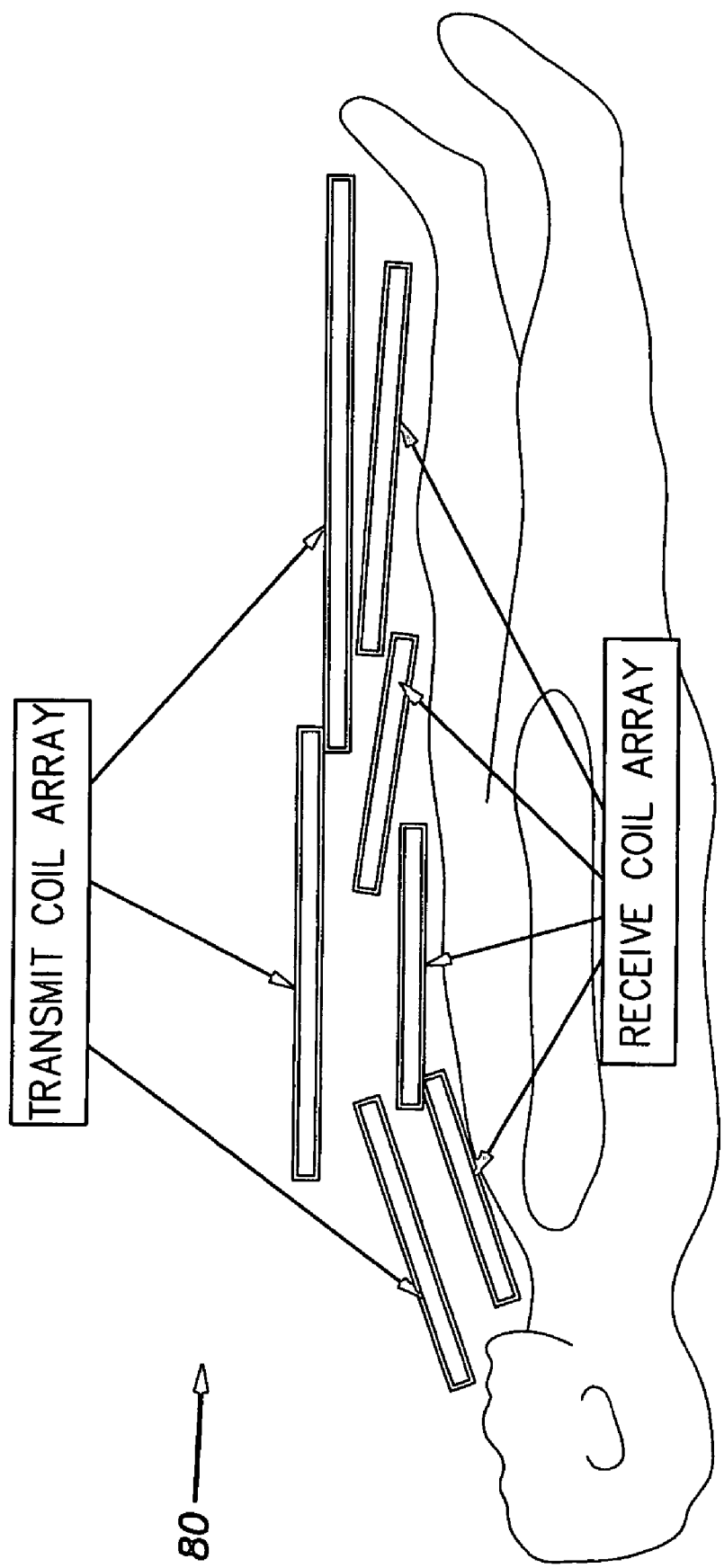
FIG. 8 is a schematic diagram of an array coil according to the invention having a cardiac and/or abdominal field of view.

Referring to FIG. 8, a similar MRI array coil 80 illustrates a MRI coil array having a FOV covering the cardiac and/or abdominal areas of the subject.

Figure 9:
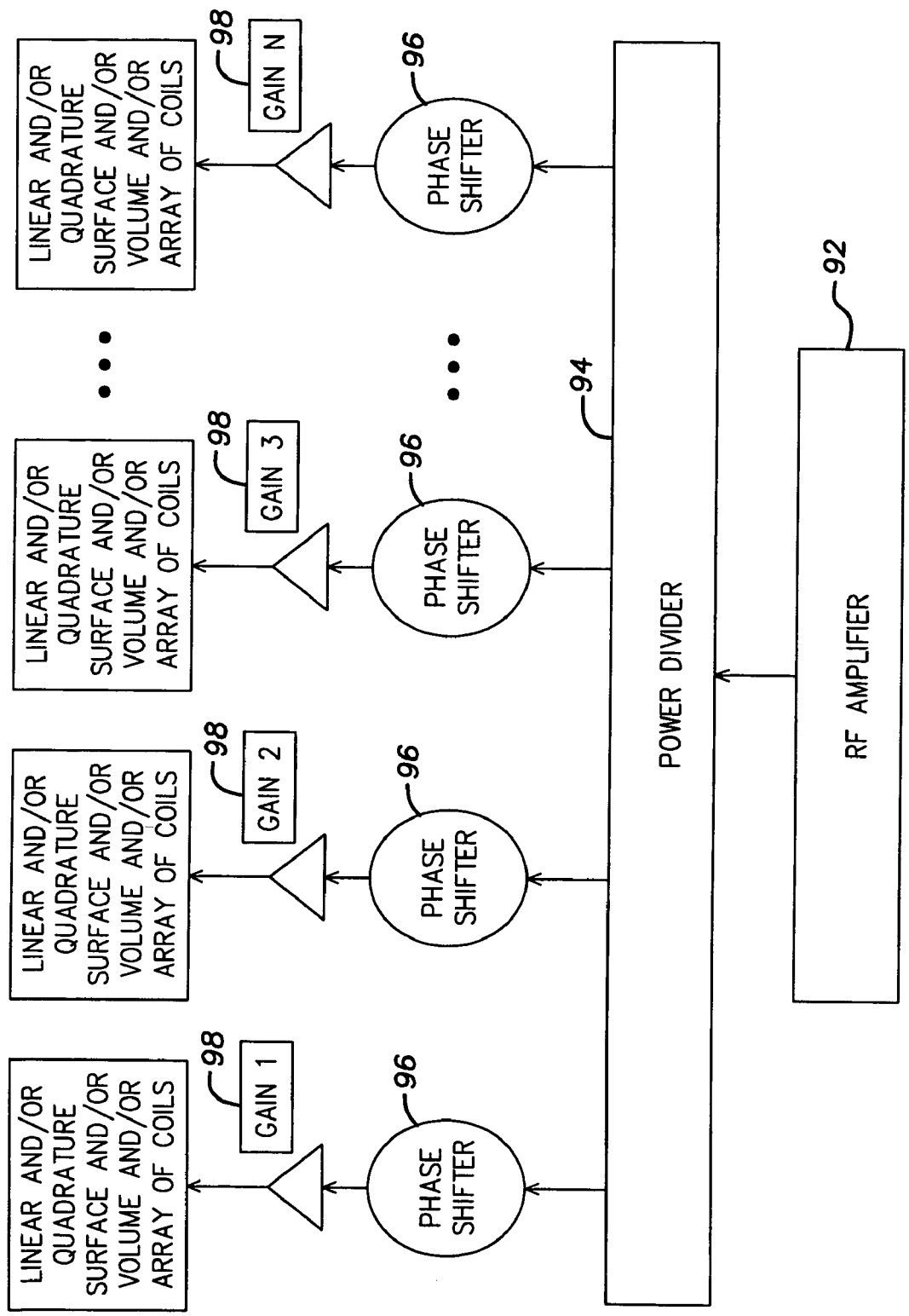
FIG. 9 is a block diagram of a possible driver configuration for the array coils of the invention.

Referring to FIG. 9, a possible driver configuration for the transmit coil array is illustrated. An RF amplifier 92 provides RF power to a divider network 94 that divides the RF power for application to each of coils of the transmit array. The phase of the signal is adjusted with a phase shifter 96 and the amplitude is adjusted with the gain 98.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A MRI array coil, said array coil comprising:
    a plurality of first coils in a receive-only coil array; and
    a plurality of second coils in a transmit-only coil array, said receive-only coil array and said transmit-only coil array being electrically disjoint, wherein at least one of the second coils in said transmit-only coil array is operational when said receive-only coil array is non-operational and each of the plurality of second coils in said transmit-only coil array being selectively operable to transmit in a field of view.

2. A MRI array coil according to claim 1, wherein said receive-only coil array and said transmit-only coil array have an equal number of said first and second coils.

3. A MRI array coil according to claim 1, wherein said receive-only coil array and said transmit-only coil array have differing numbers of said first and second coils.

4. A MRI array coil according to claim 1, wherein said array coil has a whole body field of view.

5. A MRI array coil according to claim 1, wherein said array coil has an upper body field of view.

6. A MRI array coil according to claim 1, wherein said array coil has a head and chest field of view.

7. A MRI array coil according to claim 1, wherein said array coil has a torso and/or pelvis field of view.

8. A MRI array coil according to claim 1, wherein said array coil has a knee and/or foot field of view.

9. A MRI array coil according to claim 1, wherein said array coil has a spine and/or neck field of view.

10. A MRI array coil according to claim 1, wherein said array coil has a cardiac and/or abdominal field of view.

11. A MRI array coil according to claim 1, wherein said array coil includes at least one quadrature coil pair.

12. A MRI array coil according to claim 1, wherein said array coil includes at least one surface coil.

13. A MRI array coil according to claim 1, wherein said array coil includes at least one volume coil.

14. A MRI array coil according to claim 1, wherein during receiving, at least one of said plurality of first coils in said receive-only coil array is turned on and all of said plurality of second coils in said transmit-only coil array are turned off.

15. A MRI array coil according to claim 1, wherein during transmission, at least one of said plurality of second coils in said transmit-only coil array is turned on and all of said plurality of first coils in said receive-only coil array are turned off.

16. A MRI array coil according to claim 1, wherein said plurality of first coils and second coils are configured to operate in connection with one of a horizontal and vertical MR scanner.

17. A MRI array coil according to claim 1, wherein said plurality of first coils are configured in a first electrical configuration and said plurality of second coils are configured in a different second electrical configuration.

18. A MRI array coil according to claim 17, wherein the first electrical configuration is a receive electrical configuration and the second electrical configuration is a transmit electrical configuration.

19. A MRI array coil according to claim 1, wherein said plurality of first coils are configured in a first electrical pattern and said plurality of second coils are configured in a different second electrical pattern.

20. A MRI array coil according to claim 1, wherein said plurality of first coils and said plurality of second coils are configured to be mechanically integrated as part of a single former.

21. A MRI array coil comprising:
    a transmit coil array having a plurality of coils configured to operate only during a transmission mode; and
    a receive coil array having a plurality of coils configured to operate only during a receive mode, said transmit coil array and receive coil array being electrically disjoint, wherein at least one of the coils in said transmit coil array is configured to transmit signals when said receive coil array is turned off and each of the plurality of coils in said transmit coil array being selectively controllable to transmit in a field of view smaller than a field of view covered by the transmit coil array.

22. A MRI array coil according to claim 21, wherein said transmit coil array and receive coil array are configured to be integrated into a common support structure.

23. A MRI array coil according to claim 21, wherein said plurality of coils in said transmit coil array comprise at least one of a linear and quadrature coil, and said plurality of coils in said receive coil array comprise at least one of a linear and quadrature coil.

24. A MRI array coil according to claim 21, wherein said plurality of coils in said transmit coil array comprise at least one of a surface and volume coil, and said plurality of coils in said receive coil array comprise at least one of a surface and volume coil.

25. A MRI array coil according to claim 21, wherein during said transmission mode at least one of said plurality of coils in said transmit coil array is turned on and all of said plurality of coils in said receive coil array are turned off.

26. A MRI array coil according to claim 21, wherein during said receive mode at least one of said plurality of coils in said receive coil array is turned on and all of said plurality of coils in said transmit coil array are turned off.

27. A method for magnetic resonance imaging comprising:
    configuring a first coil array to operate only during a transmission mode of operation; and
    configuring a second coil array to operate only during a receive mode of operation, said first and second coil arrays being electrically disjoint, wherein said configuring the first coil array includes configuring the first coil array to transmit signals when the second coil array is turned off and to selectively control coils of the first coil array to transmit in a field of view.

* * * * *